(12) United States Patent
Sasaki (10) Patent No.: US 11,610,929 B2
(45) Date of Patent: Mar. 21, 2023

(54) SEMICONDUCTOR ELEMENT, MANUFACTURING METHOD OF SEMICONDUCTOR ELEMENT, AND ELECTRONIC APPARATUS

(71) Applicant: SONY CORPORATION, Tokyo (JP)

(72) Inventor: Naoto Sasaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/175,065

(22) Filed: Feb. 12, 2021

(65) Prior Publication Data

US 2021/0167115 A1 Jun. 3, 2021

Related U.S. Application Data

(63) Continuation of application No. 15/960,381, filed on Apr. 23, 2018, now Pat. No. 10,950,648, which is a
(Continued)

(30) Foreign Application Priority Data

Dec. 16, 2013 (JP) ................................. 2013-258860

(51) Int. Cl.
*H01L 27/146* (2006.01)
*H01L 21/768* (2006.01)
(Continued)

(52) U.S. Cl.
CPC .. *H01L 27/14636* (2013.01); *H01L 21/76831* (2013.01); *H01L 21/76898* (2013.01);
(Continued)

(58) Field of Classification Search
CPC ......... H01L 27/14636; H01L 21/76831; H01L 21/76898; H01L 23/3114; H01L 23/481;
(Continued)

(56) References Cited

U.S. PATENT DOCUMENTS

| 4,753,855 A | 6/1988 | Haluska et al. |
| 7,935,568 B2 | 5/2011 | Oganesian et al. |

(Continued)

FOREIGN PATENT DOCUMENTS

| CN | 101848344 | 9/2010 |
| JP | 2011-082496 | 4/2011 |

(Continued)

OTHER PUBLICATIONS

International Search Report and Written Opinion for International (PCT) Patent Application No. PCT/JP2014/082212, dated Jun. 2, 2016, 6 pages.

(Continued)

*Primary Examiner* — David Vu
(74) *Attorney, Agent, or Firm* — Sheridan Ross P.C.

(57) ABSTRACT

The present disclosure relates to a semiconductor element, a manufacturing method of a semiconductor element, and an electronic apparatus, which enable suppression of crack occurrences and leaks. The present technology has a laminated structure including an insulating film having a CTE value between those of metal and Si and disposed under a metal wiring, and P—SiO (1 μm) having good coverage and disposed as a via inner insulating film in a TSV side wall portion. As the insulating film having a CTE that is in the middle between those of metal and Si, for example, SiOC is used with a thickness of 0.1 μm and 2 μm respectively in the via inner insulating film and a field top insulating film continuous to the via inner insulating film. The present disclosure can be applied to, for example, a solid-state imaging element used in an imaging device.

20 Claims, 8 Drawing Sheets

Related U.S. Application Data continuation of application No. 15/101,075, filed as application No. PCT/JP2014/082212 on Dec. 5, 2014, now Pat. No. 9,978,797.

(51) Int. Cl.

| | | |
|---|---|---|
| *H01L 23/48* | (2006.01) | |
| *H01L 23/31* | (2006.01) | |
| *H01L 23/528* | (2006.01) | |
| *H01L 23/532* | (2006.01) | |
| *H04N 5/365* | (2011.01) | |
| *H04N 5/3745* | (2011.01) | |
| *H04N 5/376* | (2011.01) | |
| *H04N 5/378* | (2011.01) | |
| *H01L 23/525* | (2006.01) | |

(52) U.S. Cl.
 CPC ........ *H01L 23/3114* (2013.01); *H01L 23/481* (2013.01); *H01L 23/528* (2013.01); *H01L 23/53295* (2013.01); *H01L 27/14618* (2013.01); *H01L 27/14683* (2013.01); *H04N 5/3658* (2013.01); *H04N 5/378* (2013.01); *H04N 5/3765* (2013.01); *H04N 5/37455* (2013.01); *H01L 23/525* (2013.01); *H01L 2224/13* (2013.01)

(58) Field of Classification Search
 CPC ............. H01L 23/528; H01L 23/53295; H01L 27/14618; H01L 27/14683; H01L 23/525; H01L 2224/13; H01L 21/3205; H04N 5/3658; H04N 5/37455; H04N 5/3765; H04N 5/378
 See application file for complete search history.

(56) References Cited

U.S. PATENT DOCUMENTS

| | | | |
|---|---|---|---|
| 9,559,001 B2 | 1/2017 | Yen et al. | |
| 9,978,797 B2 | 5/2018 | Sasaki | |
| 10,950,648 B2 | 3/2021 | Sasaki | |
| 2005/0194670 A1 | 9/2005 | Kameyama et al. | |
| 2008/0251932 A1 | 10/2008 | Arana et al. | |
| 2009/0283311 A1* | 11/2009 | Ida | H01L 27/14683 29/846 |
| 2009/0309235 A1* | 12/2009 | Suthiwongsunthorn | H01L 24/94 257/E23.141 |
| 2010/0090304 A1 | 4/2010 | Liu et al. | |
| 2011/0068476 A1* | 3/2011 | Kawasaki | H01L 27/14683 257/E21.546 |
| 2012/0156823 A1 | 6/2012 | Myung et al. | |

FOREIGN PATENT DOCUMENTS

| | | |
|---|---|---|
| JP | 2012-244100 | 12/2012 |
| JP | 2013-165099 | 8/2013 |
| WO | WO 2011/125935 | 10/2011 |

OTHER PUBLICATIONS

Official Action (with English translation) for Chinese Patent Application No. 201480066578.5, dated Apr. 20, 2018, 17 pages.

Official Action (with English translation) for Japanese Patent Application No. 2015-553478, dated May 31, 2018, 12 pages.

Official Action (with English translation) for Japanese Patent Application No. 2015-553478, dated Sep. 4, 2018, 11 pages.

Official Action for U.S. Appl. No. 15/101,075, dated Jul. 10, 2017, 8 pages.

Notice of Allowance for U.S. Appl. No. 15/101,075, dated Jan. 23, 2018, 5 pages.

Official Action for U.S. Appl. No. 15/960,381, dated Sep. 10, 2018, 7 pages.

Official Action for U.S. Appl. No. 15/960,381, dated Jan. 15, 2019, 9 pages.

Official Action for U.S. Appl. No. 15/960,381, dated May 10, 2019, 11 pages.

Official Action for U.S. Appl. No. 15/960,381, dated Oct. 10, 2019, 13 pages.

Official Action for U.S. Appl. No. 15/960,381, dated Feb. 12, 2020, 11 pages.

Official Action for U.S. Appl. No. 15/960,381, dated Jun. 22, 2020, 11 pages.

Notice of Allowance for U.S. Appl. No. 15/960,381, dated Nov. 12, 2020, 7 pages.

\* cited by examiner

SEMICONDUCTOR ELEMENT, MANUFACTURING METHOD OF SEMICONDUCTOR ELEMENT, AND ELECTRONIC APPARATUS

CROSS REFERENCE TO RELATED APPLICATIONS

This application is a continuation of U.S. patent application Ser. No. 15/960,381, filed Apr. 23, 2018, which is a continuation of U.S. patent application Ser. No. 15/101,075, filed Jun. 2, 2016, now U.S. Pat. No. 9,978,797, which is a national stage application under 35 U.S.C. 371 and claims the benefit of PCT Application No. PCT/JP2014/082212 having an international filing date of Dec. 5, 2014, which designed the United States, which PCT application claimed the benefit of Japanese Priority Patent Application JP 2013-258860 filed Dec. 16, 2013, the disclosures of which are incorporated herein by reference in their entirety.

TECHNICAL FIELD

The present disclosure relates to a semiconductor element, a manufacturing method of a semiconductor element, and an electronic apparatus, and particularly relates to a semiconductor element, a manufacturing method of a semiconductor element, and an electronic apparatus, which enable suppression of crack occurrences and leaks.

BACKGROUND ART

When the chip size package (CSP) having a through silicon via (TSV) in its structure proposed in Patent Literature 1 was mounted to a substrate and subjected to a temperature cycle test, an insulating film (such as SiO and SiN) that is a layer under RDL_CU sometimes cracked. This is because SiO and SiN have a coefficient of thermal expansion (CTE) that is 1 to 2 digits smaller than materials around SiO and SiN, such that temperature cycle causes a large stress to be generated.

Specifically, the CTE of each material is 17 ppm for Cu, 0.6 ppm for SiO, 1.0 ppm for SiN, 3.2 ppm for Si, 55 ppm for SM, 31 ppm for solder, and 15 to 20 ppm for a substrate. The insulating film is subjected to both a stress caused by the CTE difference (16 ppm) from Cu and a stress caused by the CTE difference (2.6 ppm) from Si at the same time.

As a countermeasure to this, Patent Literature 2 proposes a method of setting the CTE of the insulating film between Si and metal.

CITATION LIST

Patent Literature

Patent Literature 1: 7P 2010-161215A

Patent Literature 2: JP 2008-306134A

SUMMARY OF INVENTION

Technical Problem

However, the method of setting the CTE of the insulating film between Si and metal had difficulties in ensuring coverage on the TSV bottom, possibly causing leaks to occur.

The present disclosure has been achieved in view of such circumstances, and enables suppression of crack occurrences and leaks.

Solution to Problem

A semiconductor element according to an aspect of the present technology includes: a through silicon via (TSV) formed in a substrate, a side wall film formed in a side wall portion of the TSV and having good coverage; and an insulating film formed in a layer under a metal wiring except for a via portion of the TSV. The insulating film is of a film type in which a coefficient of thermal expansion has a value between a coefficient of thermal expansion for the substrate and a coefficient of thermal expansion for the metal wiring.

The insulating film is laminated to the side wall film in the side wall portion of the TSV.

The side wall film is a plasma oxide film.

The side wall film is formed on a whole surface and thereafter completely removed on a field by etch back.

The insulating film includes films of a plurality of film types laminated.

The substrate under the metal wiring is slit to form a slit, and the insulating film is embedded in the slit.

The semiconductor element has a chip size package (CSP) structure.

The semiconductor element is a solid-state imaging element.

A manufacturing method of a semiconductor element according to an aspect of the present technology includes: forming, by a manufacturing apparatus, a side wall film having good coverage, on a side wall portion of a through silicon via (TSV) formed in a substrate; and forming, by the manufacturing apparatus, an insulating film in a layer under a metal wiring except for a via portion of the TSV.

An electronic apparatus according to an aspect of the present technology includes: a solid-state imaging element including a through silicon via (TSV) formed in a substrate, a side wall film formed in a side wall portion of the TSV and having good coverage, and an insulating film formed in a layer under a metal wiring except for a via portion of the TSV, the insulating film being of a film type in which a coefficient of thermal expansion has a value between a coefficient of thermal expansion for the substrate and a coefficient of thermal expansion for the metal wiring; an optical system that allows an incident light to enter the solid-state imaging element; and a signal processing circuit that processes an output signal output from the solid-state imaging element.

In an aspect of the present technology, a side wall film that is a film having good coverage is formed on a side wall portion of a through silicon via (TSV) formed in a substrate. Then, an insulating film is formed in a layer under a metal wiring except for a via portion of the TSV.

Advantageous Effects of Invention

According to the present technology, the crack occurrences and leaks can be suppressed.

It is noted that the effects described herein are merely exemplary. The effects of the present technology are not limited to the effects described herein, and may include additional effects.

DESCRIPTION OF EMBODIMENTS

Hereinafter, a mode for carrying out the present disclosure (hereinafter, referred to as an embodiment) will be described. It is noted that description will be provided in the following order.
0. Schematic configuration example of solid-state imaging element
1. First embodiment (example of solid-state imaging element)
2. Second embodiment (example of electronic apparatus)

0. Schematic Configuration Example of Solid-State Imaging Element

Schematic Configuration Example of Solid-State Imaging Element

Figure 1:
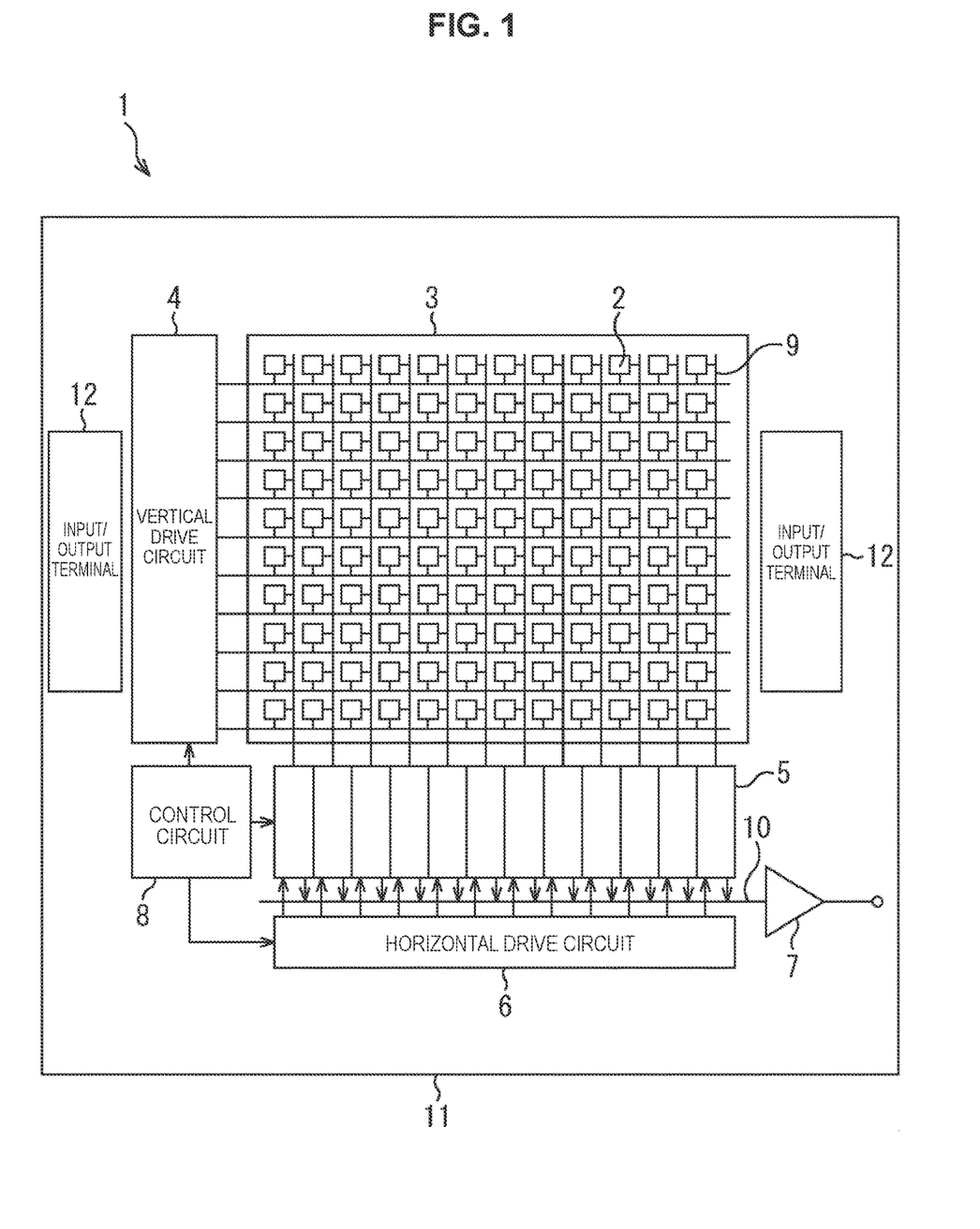
FIG. 1 is a block diagram illustrating a schematic configuration example of a solid-state imaging element to which the present technology is applied.

FIG. 1 illustrates a schematic configuration example of an example of a complementary metal oxide semiconductor (CMOS) solid-state imaging element applied to each embodiment of the present technology.

As illustrated in FIG. 1, a solid-state imaging element (element chip) 1 includes: a pixel region (so-called imaging region) 3 in which a plurality of pixels 2 each containing a photoelectric conversion element is regularly arranged in a two-dimensional manner on a semiconductor substrate 11 (for example, a silicon substrate); and a peripheral circuit section.

The pixel 2 has a photoelectric conversion element (for example, a photodiode) and a plurality of pixel transistors (so-called MOS transistors). The plurality of pixel transistors may be constituted by, for example, three transistors including a transfer transistor, a reset transistor, and an amplification transistor. Furthermore, a selection transistor may be added so that the pixel transistors are constituted by four transistors. The equivalent circuit of each pixel 2 (unit pixel) is similar to any known equivalent circuit, and therefore detailed description is omitted here.

The pixel 2 may be configured to have a shared pixel structure. The pixel shared structure is constituted by a plurality of photodiodes, a plurality of transfer transistors, one floating diffusion to be shared, and another each transistor to be shared.

The peripheral circuit portion includes a vertical drive circuit 4, a column signal processing circuit 5, a horizontal drive circuit 6, an output circuit 7, and a control circuit 8.

The control circuit 8 receives an input clock and a data for commanding an action mode and the like, and outputs data such as internal information of the solid-state imaging device 1. Specifically, the control circuit 8 generates a clock signal and a control signal which serve as criteria for the actions by the vertical drive circuit 4, the column signal processing circuit 5, and the horizontal drive circuit 6, based on a vertical synchronization signal, a horizontal synchronization signal, and a master clock. Then, the control circuit 8 inputs these signals into the vertical drive circuit 4, the column signal processing circuit 5, and the horizontal drive circuit 6.

The vertical drive circuit 4 is constituted by, for example, a shift resistor, selects a pixel drive wiring, supplies the selected pixel drive wiring with a pulse for driving the pixel 2, and drives the pixels 2 row by row. Specifically, the vertical drive circuit 4 sequentially selects and scans each pixel 2 in the pixel region 3 row by row in the vertical direction, and supplies the column signal processing circuit 5 with a pixel signal based on a signal charge generated according to the amount of received light in the photoelectric conversion element of each pixel 2 through a vertical signal line 9.

The column signal processing circuit 5 is disposed, for example, for each column of the pixels 2, and performs signal processing such as noise removal of signals output from one row of the pixels 2 for each pixel column. Specifically, the column signal processing circuit 5 performs signal processing such as correlated double sampling (CDS) for removing a fixed pattern noise specific to the pixel 2, signal amplification, and analog/digital (A/D) conversion. In an output stage of the column signal processing circuit 5, a horizontal selection switch (not illustrated) is connected between the column signal processing circuit 5 and a horizontal signal line 10.

The horizontal drive circuit 6 is constituted by, for example, a shift resistor, sequentially outputs a horizontal scanning pulse thereby to select each of the column signal processing circuits 5 in order, and causes each of the column signal processing circuits 5 to output a pixel signal to the horizontal signal line 10.

The output circuit 7 processes a signal sequentially supplied from each of the column signal processing circuits 5 through the horizontal signal line 10, and outputs the processed signal. The output circuit 7 may perform only buffering or the like, or may perform black level adjustment, column variation correction, various types of digital signal processing, or the like.

An input and output terminal 12 is disposed for externally exchanging a signal.

1. First Embodiment

Cross-Sectional Example of Solid-State Imaging Element

Figure 2:
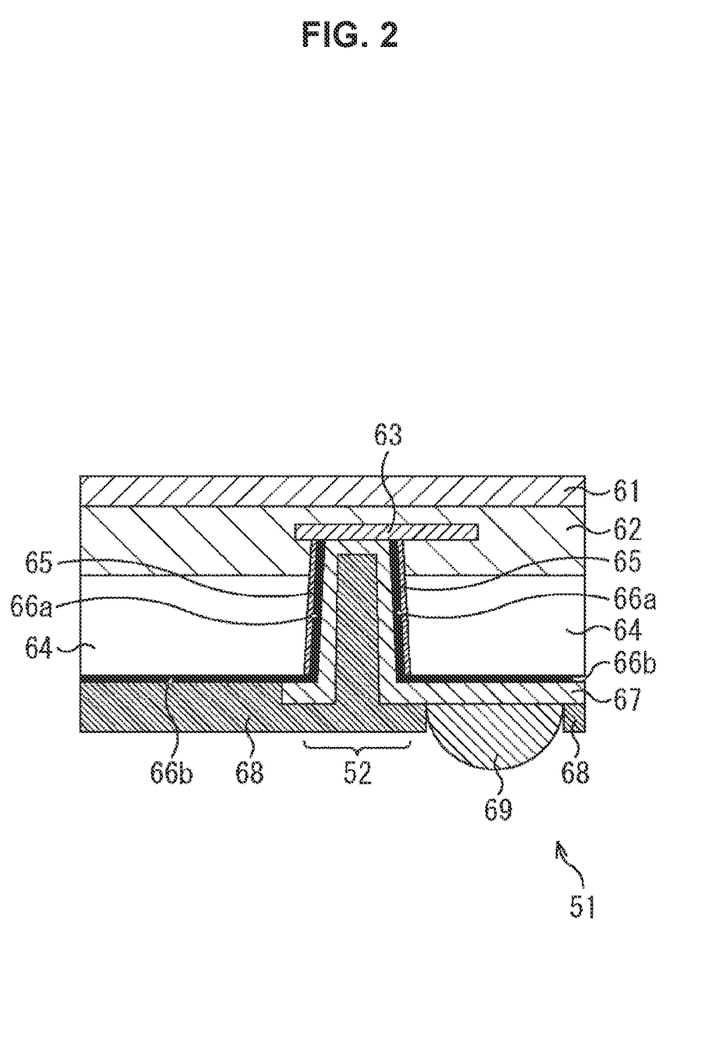
FIG. 2 is a cross-sectional diagram illustrating a configuration example of a solid-state imaging element to which the present technology is applied.

FIG. 2 is a cross-sectional diagram illustrating a configuration of a solid-state imaging element to which the semiconductor element according to the present technology is applied. In an example of FIG. 2, a solid-state imaging element is illustrated as an example of a chip size package (CSP) having in its structure a through silicon via (TSV) mounted in a substrate.

In a solid-state imaging element 51 according to the example of FIG. 2, an SiO2 layer 62 is formed on an Si substrate 64 as a support substrate, and an Si layer 61 is formed thereon. An AL pad 63 is embedded in the SiO2 layer 62, and a TSV 52 having the AL pad 63 on its bottom is formed in the SiO2 layer 62 and the Si substrate 64.

In this example, the TSV 52 has, for example, a diameter of 70 μl and a depth of 100 μm. A via inner insulating film 65 and a via inner insulating film 66a are laminated to a side wall portion of the inside of the TSV 52. Furthermore, a field top insulating film 66b extending from the via inner insulating film 66a is illustrated on a field that is the lower surface of the Si substrate 64 in the diagram.

In addition, a metal wiring 67 is provided with 10 μm such that it covers the inside of the TSV 52. On the metal wiring 67, a solder ball 69 is formed, and a solder mask 68 is formed.

Here, Si of the Si substrate 64 has a coefficient of thermal expansion (CTE) of 3.2 ppm, and a redistribution layer (RDL)_CU used as the metal wiring 67 has a CTE of 17 ppm.

In the present technology, an insulating film of a film type having a CTE between those of metal and Si is used under the metal wiring 67, and the side wall portion of the TSV 52 has a structure in which the insulating film is laminated to a plasma oxide film: P—SiO (1 μm) having good coverage as the via inner insulating film 65. The coverage refers to a ratio in film thickness between on the field and on the bottom. It is noted that a film other than the plasma oxide film may be used, as long as it has good coverage. For example, P—SiON and P—SiO may be used.

In the example of FIG. 2, SiOC is used with a thickness of 0.1 μm and 2 μm respectively in the via inner insulating film 66a and in the field top insulating film 66b continuous to the via inner insulating film 66a as an insulating film having a CTE that is between those of metal and Si. It is noted that the support substrate is not limited to Si, and a material having a larger CTE may be used for the support substrate.

SiOC has a CTE of 11 ppm, which differs from Si by 7.8 ppm and from CU by 6 ppm. That is, the CTE is between those of metal and Si.

Since the insulating film having a CTE between those of metal and Si is placed under the metal wiring as described above, stress concentration on the insulating film can be eliminated, enabling suppression of crack occurrences. In addition, the TSV bottom (side wall portion) has a laminated structure of the insulating film and the P—SiO having good coverage. This can suppress leaks in the via bottom, thereby improving reliability of a semiconductor having a CSP structure.

It is noted that the insulating film having a CTE between those of metal and Si is not limited to the above-described SiOC, and the following film type may also be used.

SiC has a CTE of 4.4 ppm, which differs from Si by 1.2 ppm and from CU by 12.6 ppm. SiCN has a CTE of 11 ppm, which differs from Si by 7.8 ppm and from CU by 6 ppm. Al2O3 has a CTE of 7.2 ppm, which differs from Si by 4 ppm and from CU by 9.8 ppm. ZrO2 has a CTE of 10.5 ppm, which differs from Si by 7.3 ppm and from CU by 6.5 ppm.

At least one or more of these film types may be laminated. Among these, the value of the CTE between those of metal and Si is most preferably the value that is almost in the middle between both. It is noted that although FIG. 8 will be referred to in the following description, it is preferable that a film having a smaller CTE difference from Si be laminated on the Si side, and a film having a smaller CTE difference from CU be laminated on the CU side, when a plurality of layers are laminated.

Manufacturing Process of Solid-State Imaging Element

Figure 3:
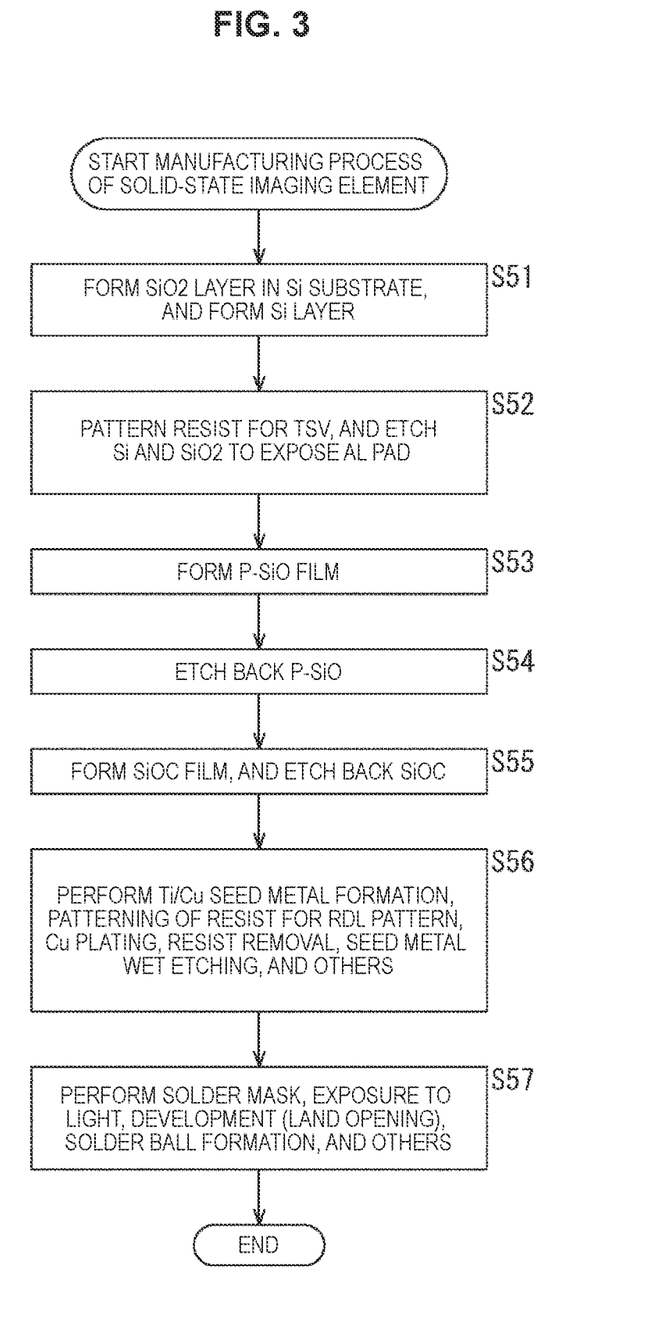
FIG. 3 is a flow chart for explaining a manufacturing process of a solid-state imaging element.

Next, the manufacturing process of the solid-state imaging element according to the present technology will be described with reference to a flow chart of FIG. 3 and step charts of FIG. 4 to FIG. 6.

It is noted that this process is a process performed by a manufacturing apparatus for manufacturing the solid-state imaging element 51.

Figure 4:
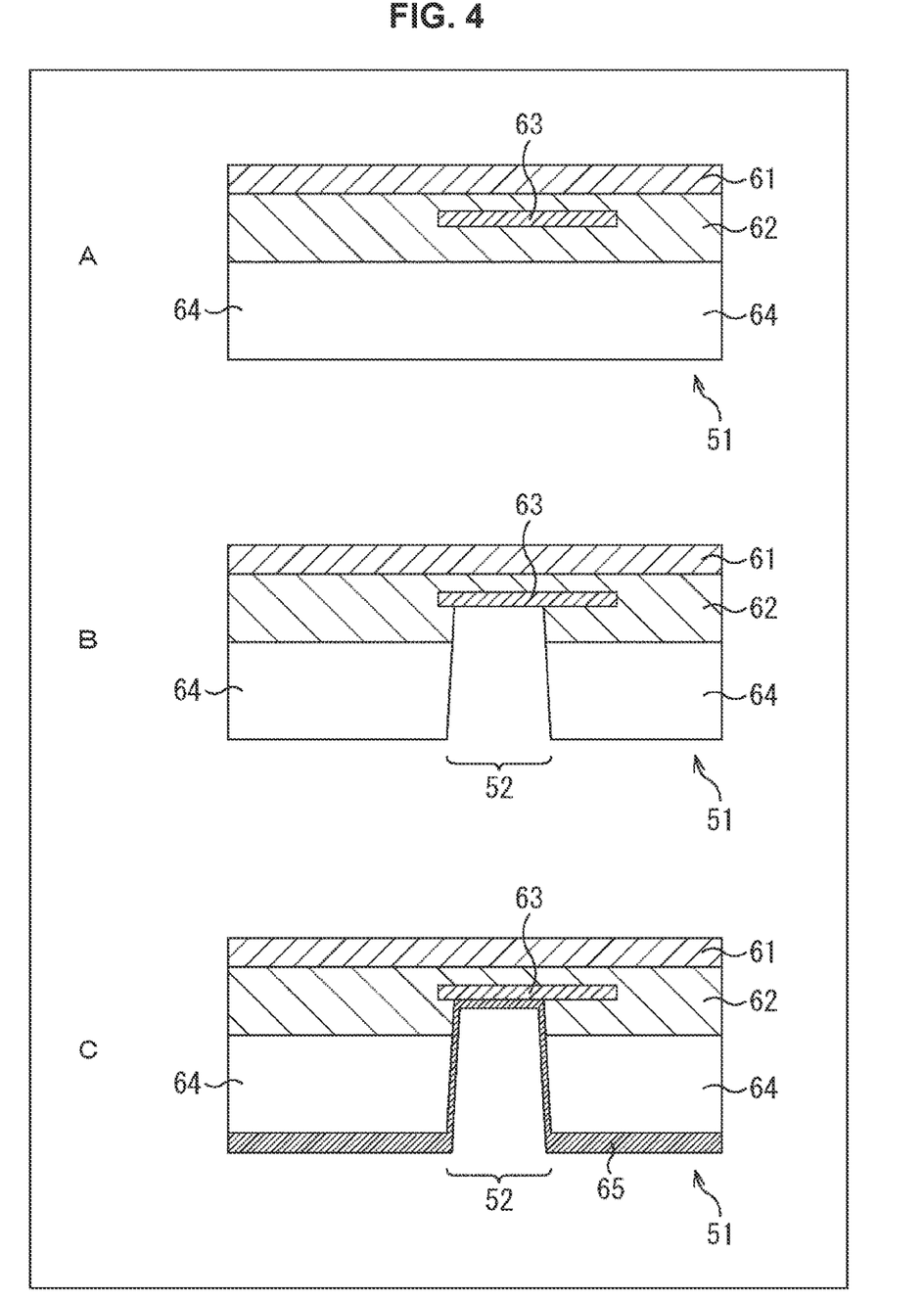
FIG. 4 is a diagram illustrating a manufacturing step of a solid-state imaging element.

First, in step S51, as illustrated in A of FIG. 4, the manufacturing apparatus forms, for example, the SiO2 layer 62, in which the AL pad 63 is embedded, on the Si substrate 64, and forms the Si layer 61.

In step S52, as illustrated in B of FIG. 4, the manufacturing apparatus patterns a resist for the TSV 52 having the AL pad 63 as its bottom, and etches the Si substrate 64 and the SiO2 layer 62 to expose the AL pad 63.

In step S53, as illustrated in C of FIG. 4, the manufacturing apparatus forms the via inner insulating film (for example, P—SiO) 65 on the whole surface.

Figure 5:
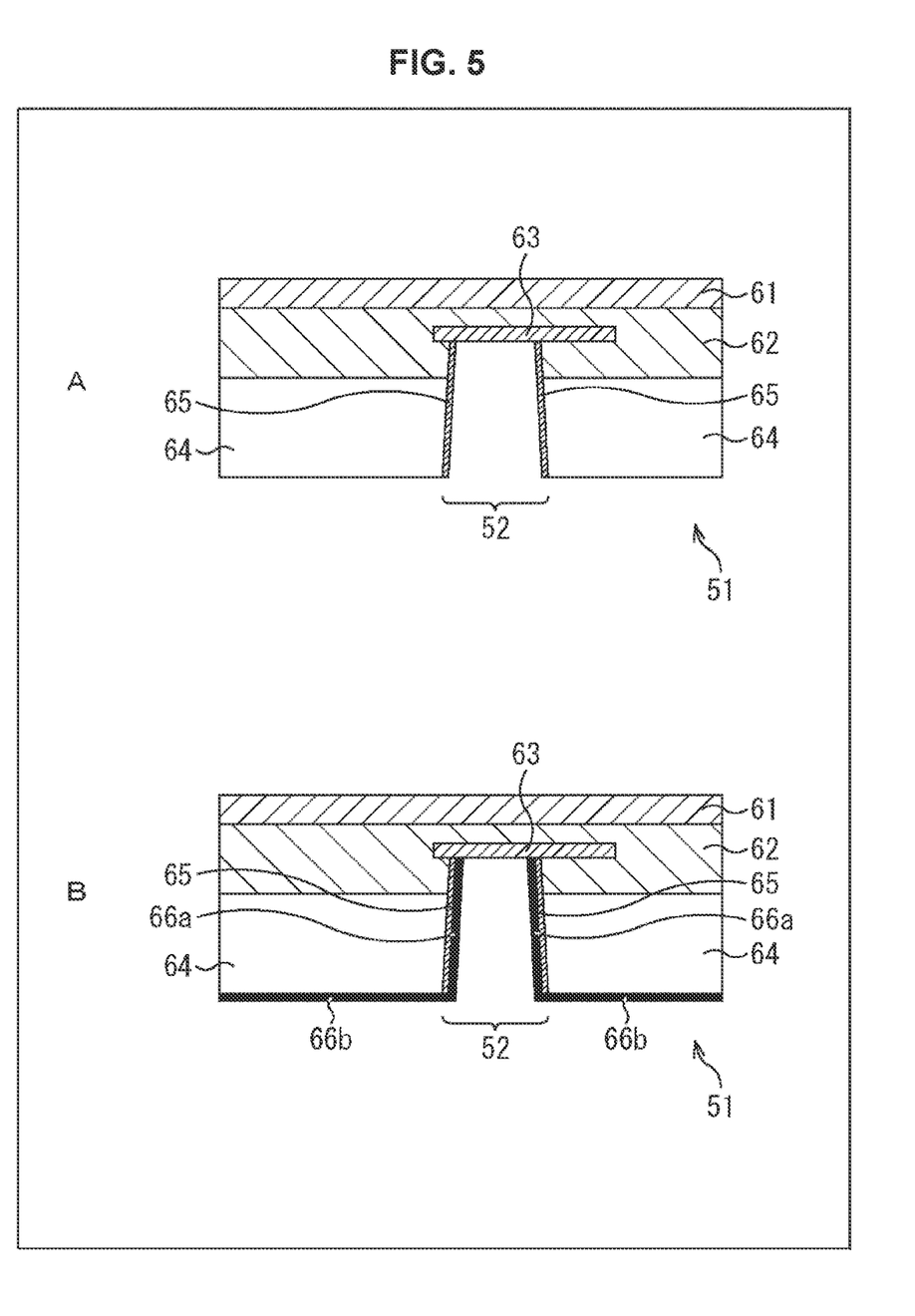
FIG. 5 is a diagram illustrating a manufacturing step of a solid-state imaging element.

In step S54, as illustrated in A of FIG. 5, the manufacturing apparatus etches back the via inner insulating film 65. At this time, the film on the field that is the lower surface of the Si substrate 64 in the diagram and the via inner insulating film 65 on the bottom of the TSV 52 are removed. The film on the side wall portion of the TSV 52 is left with 1 μm.

In step S55, as illustrated in B of FIG. 5, the manufacturing apparatus forms the via inner insulating film (for example, SiOC) 66a and the field top insulating film (for example, SiOC) 66b, and etches back the formed films. At this time, the field top insulating film 66b on the field that is the lower surface of the Si substrate 64 in the diagram is left with 2 μm, but the via inner insulating film 66a on the bottom of the TSV 52 is removed. The via inner insulating film 66a on the side wall portion of the TSV 52 is left with 0.1 μm.

In step S56, the manufacturing apparatus performs formation of a Ti/Cu seed metal, patterning of a resist for an RDL pattern, formation of the metal wiring 67 by Cu plating (10 μm), removal of a resist, wet etching of the seed metal, and the like. This enables formation of the metal wiring 67 made of Cu as illustrated in A of FIG. 6.

Figure 6:
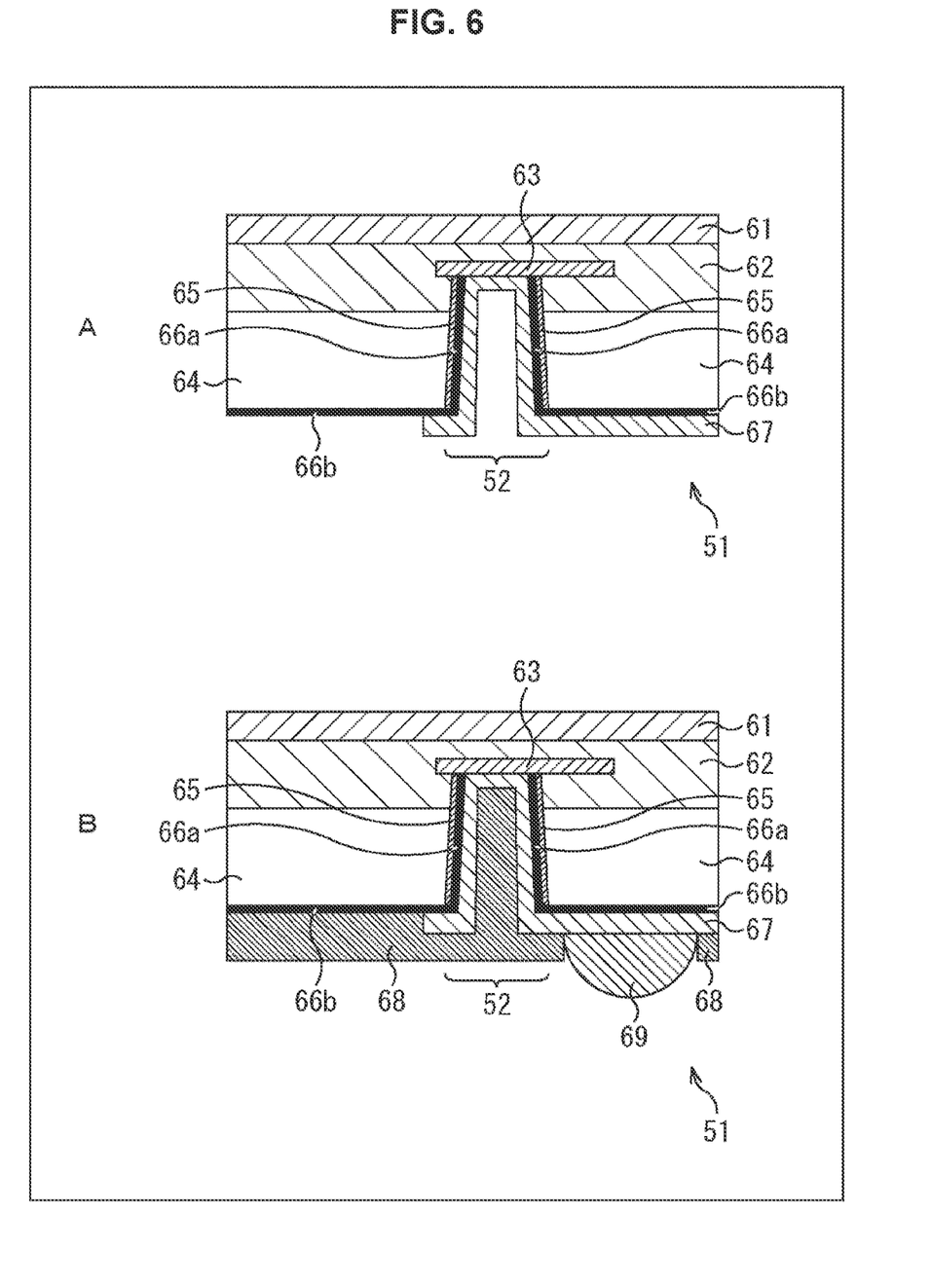
FIG. 6 is a diagram illustrating a manufacturing step of a solid-state imaging element.

In step S57, as illustrated in B of FIG. 6, the manufacturing apparatus performs formation of the solder mask 68, exposure to light, development (land opening), formation of the solder ball 69, and the like.

In this manner, there is formed the solid-state imaging element 51 described above by referring to FIG. 2.

Another Cross-Sectional Example of Solid-State Imaging Element

Figure 7:
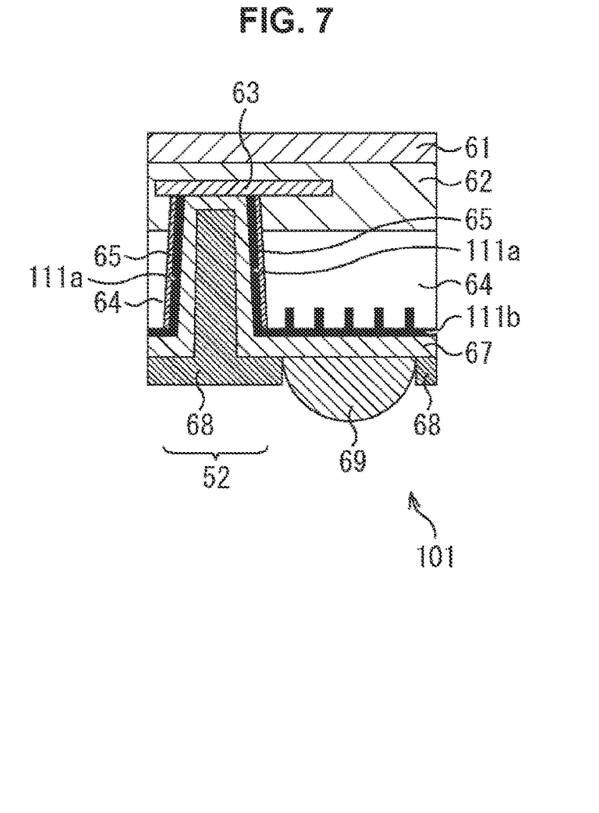
FIG. 7 is a cross-sectional diagram illustrating another configuration example of a solid-state imaging element to which the present technology is applied.

FIG. 7 is a cross-sectional diagram illustrating another configuration of a solid-state imaging element to which the semiconductor element according to the present technology is applied.

A solid-state imaging element 101 of FIG. 7 is the same as the solid-state imaging element 51 of FIG. 4, in terms of including the Si layer 61, the SiO2 layer 62, the AL pad 63, the Si substrate 64, the via inner insulating film (for example, P—SiO) 65, the metal wiring 67, the solder mask 68, and the solder ball 69.

The solid-state imaging element 101 is different from the solid-state imaging element 51 of FIG. 4, in terms of the via inner insulating film (for example, SiOC) 66a and the field top insulating film (for example, SiOC) 66b replaced with a via inner insulating film (for example, SiOC) 111a and a field top insulating film (for example, SiOC) 111b.

That is, in the solid-state imaging element 101 of FIG. 7, the Si substrate 64 that is the layer under the metal wiring 67 is, for example, slit to form a slit having a slit width of 10 µm and a depth of 10 µm by dry etching or the like, and an insulating film (for example, SiOC) 111b is embedded into the slit.

It is noted that the shape of the slit is not limited to the above-described example.

When the Si layer that is the layer under the metal wiring 67 is slit to form a slit, and an insulating film is embedded into the slit as described above, a stress from the Si substrate 64 can be made further smaller than in the example of FIG. 4.

Another Cross-Sectional Example of Solid-State Imaging Element

Figure 8:
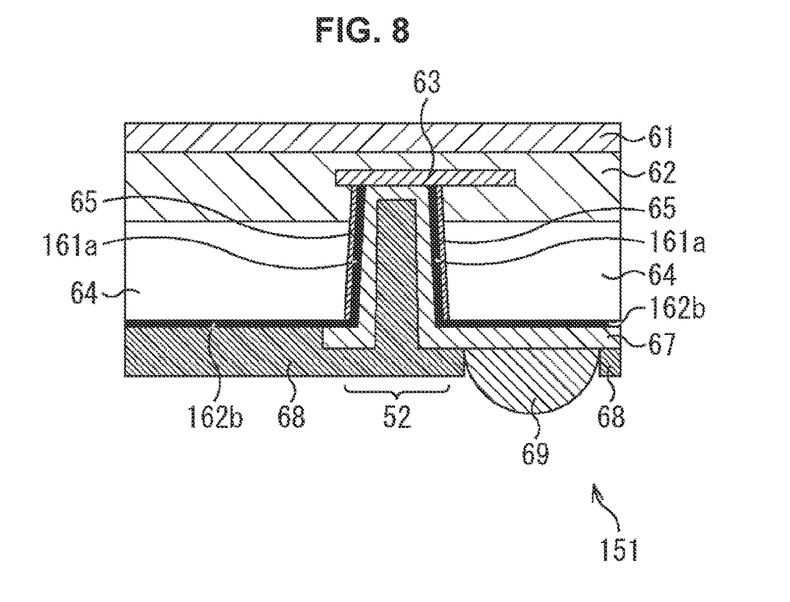
FIG. 8 is a cross-sectional diagram illustrating further another configuration example of a solid-state imaging element to which the present technology is applied.

FIG. 8 is a cross-sectional diagram illustrating another configuration of a solid-state imaging element to which the present technology is applied.

A solid-state imaging element 151 of FIG. 8 is the same as the solid-state imaging element 51 of FIG. 4, in terms of including the Si layer 61, the SiO2 layer 62, the AL pad 63, the Si substrate 64, the metal wiring 67, the solder mask 68, and the solder ball 69.

The solid-state imaging element 151 is different from the solid-state imaging element 51 of FIG. 4, in terms of the via inner insulating film (for example, SiOC) 66a and the field top insulating film (for example, SiOC) 66b replaced with a via inner insulating film 161a and a field top insulating film 161b.

That is, the solid-state imaging element 151 of FIG. 8 is different from the solid-state imaging element 101 of FIG. 4, in terms of the field top insulating film 161b including 2.5 µm of SiC as a film in contact with the Si substrate 64 and 2.5 µm of SiCN as a film in contact with the metal wiring 67.

In this manner, the insulating film may be configured to include films of a plurality of film types. It is noted that the via inner insulating film 161a may or may not have the same laminated structure as the field top insulating film 161b.

Since the insulating film having a. CTE between those of metal and Si is placed under the metal wiring as described above, stress concentration on the insulating film can be eliminated, enabling suppression of crack occurrences. Furthermore, the TSV bottom (side wall portion) has a laminated structure with the P—SiO having good coverage. This can suppress leaks in the via bottom, thereby improving reliability of a semiconductor having a CSP structure.

It is noted that although the TSV of the solid-state imaging element has been described above as an example, the present technology can be applied to any bump.

Furthermore, the present technology can be applied to a back-surface irradiation type solid-state imaging element and a front-surface irradiation type solid-state imaging element. The present technology can also be applied to a laminated-type solid-state imaging element. Although the configuration in which the present technology is applied to the CMOS solid-state imaging element has been described, the present technology may be applied to a solid-state imaging element such as a charge coupled device (CCD) solid-state imaging element.

The present technology is not limited to the application to a solid-state imaging element, and also applicable to an imaging device. Here, the imaging device refers to an electronic apparatus having an imaging function, for example, a camera system such as a digital still camera and a digital video camera, and a mobile phone. The imaging device also includes a module form mounted to an electronic apparatus, that is, a camera module, in some cases. Furthermore, the present technology may be applied, not only to a solid-state imaging element, but also to a semiconductor element.

2. Second Embodiment

Configuration Example of Electronic Equipment

Here, a configuration example of an electronic apparatus according to the second embodiment of the present technology will be described with reference to FIG. 9.

Figure 9:
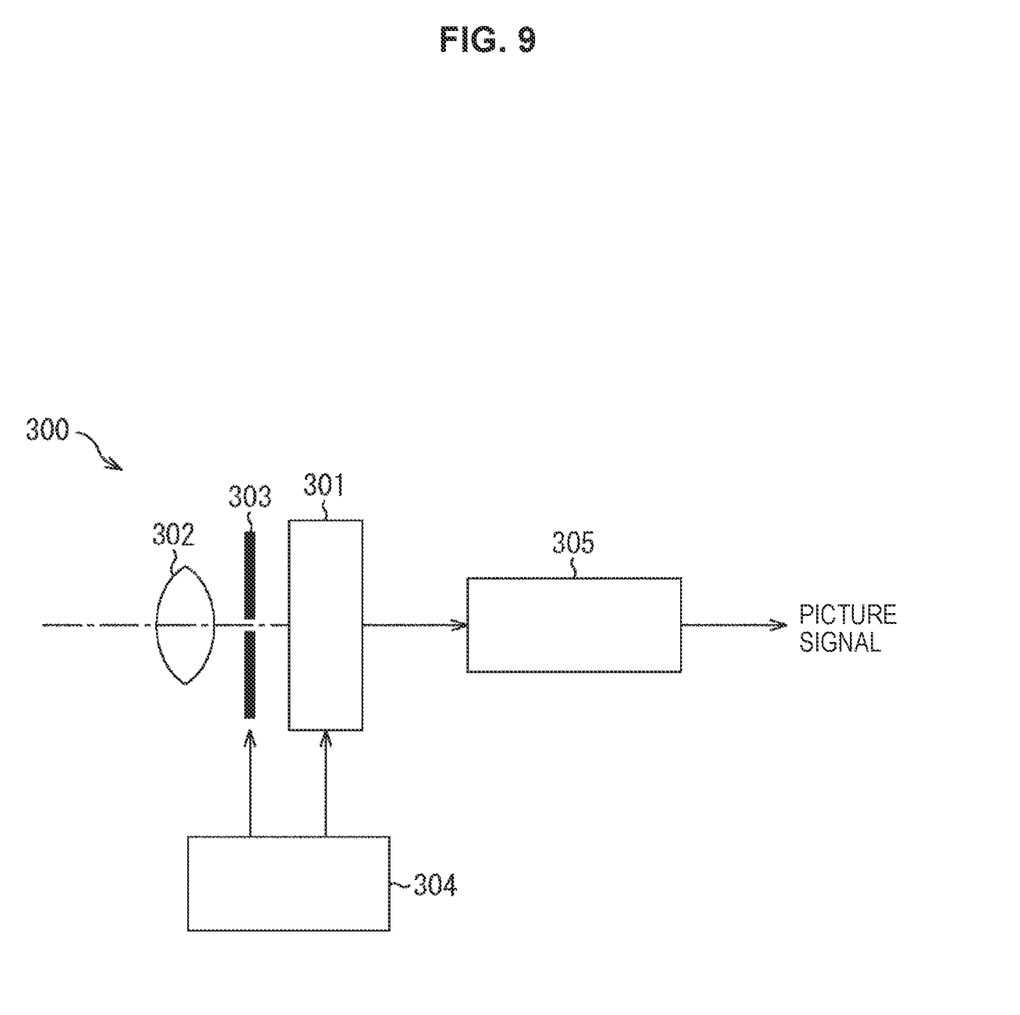
FIG. 9 is a block diagram illustrating a configuration example of an electronic apparatus to which the present technology is applied.

An electronic apparatus 300 illustrated in FIG. 9 includes a solid-state imaging element (element chip) 301, an optical lens 302, a shutter device 303, a drive circuit 304, and a signal processing circuit 305. As the solid-state imaging element 301, the above-described solid-state imaging element 51 according to the first embodiment is disposed. Therefore, the crack occurrences and leaks in the via bottom can be suppressed.

The optical lens 302 allows an image light (incident light) from an imaging subject to form an image on the imaging surface of the solid-state imaging element 301. Accordingly, a signal charge is accumulated in the solid-state imaging element 301 for a certain period of time. The shutter device 303 controls a light illuminating period and a light shielding period to the solid-state imaging element 301.

The drive circuit 304 supplies a drive signal for controlling a signal transfer action by the solid-state imaging element 301 and a shutter action by the shutter device 303. The solid-state imaging element 301 transfers a signal according to a drive signal (a timing signal) supplied from the drive circuit 304. The signal processing circuit 305 performs various types of signal processing to a signal output from the solid-state imaging element 301. A picture signal having been subjected to signal processing is stored in a storage medium such as a memory, or is output to a monitor.

In the present disclosure, steps of describing the above series of processes may include processing performed in titre-series according to the description order and processing not processed in time-series but performed in parallel or individually.

An embodiment of the disclosure is not limited to the embodiments described above, and various changes and modifications may be made without departing from the scope of the disclosure.

Further, each step described by the above mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

In addition, a configuration described as one device (or processing unit) in the above description may be divided to be configured as a plurality of devices (or processing units). Conversely, a configuration described as a plurality of devices (or processing units) above may be put together to configure them as one device (or processing unit). In addition, configurations other than those described above may of course be added to the configuration of each device (or each processing unit). Furthermore, a part of the configuration of a certain device (or processing unit) may be included in the configuration of another device (or another processing unit) as long as overall configurations and operations of a system are substantially the same. An embodiment of the disclosure is not limited to the embodiments described above, and various changes and modifications may be made without departing from the scope of the disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Additionally, the present technology may also be configured as below (1)
A semiconductor element, including:
a through silicon via (TSV) formed in a substrate;
a side wall film formed in a side wall portion of the TSV and having good coverage; and
an insulating film formed in a layer under a metal wiring except for a via portion of the TSV,
wherein the insulating film is of a film type in which a coefficient of thermal expansion has a value between a coefficient of thermal expansion for the substrate and a coefficient of thermal expansion for the metal wiring.

(2)
The semiconductor element according to (1),
wherein the insulating film is laminated to the side wall film in the side wall portion of the TSV.

(3)
The semiconductor element according to (1) or (2),
wherein the side wall film is a plasma oxide film.

(4)
The semiconductor element according to any of (1) to (3),
wherein the side wall film is formed on a whole surface and thereafter completely removed on a field by etch back.

(5)
The semiconductor element according to any of (1) to (4),
wherein the insulating film includes films of a plurality of film types laminated.

(6)
The semiconductor element according to any of (1) to (5),
wherein the substrate under the metal wiring is slit to form a slit, and the insulating film is embedded in the slit.

(7)
The semiconductor element according to any of (1) to (6),
wherein the semiconductor element has a chip size package (CSP) structure.

(8)
The semiconductor element according to any of (1) to (7),
wherein the semiconductor element is a solid-state imaging element.

(9)
A manufacturing method of a semiconductor element, including:
forming, by a manufacturing apparatus, a side wall film having good coverage, on a side wall portion of a through silicon via (TSV) formed in a substrate; and
forming, by the manufacturing apparatus, an insulating film in a layer under a metal wiring except for a via portion of the TSV.

(10)
An electronic apparatus, including:
a solid-state imaging element including
a through silicon via (TSV) formed in a substrate,
a side wall film formed in a side wall portion of the TSV and having good coverage, and
an insulating film firmed in a layer under a metal wiring except for a via portion of the TSV, the insulating film being of a film type in which a coefficient of thermal expansion has a value between a coefficient of thermal expansion for the substrate and a coefficient of thermal expansion for the metal wiring;
an optical system that allows an incident light to enter e solid-state imaging element; and
a signal processing circuit that processes an output signal output from the solid-state imaging element.

REFERENCE SIGNS LIST 1 solid-state imaging element
51 solid-state imaging element
52 TSV
61 Si layer
62 wiring layer
63 AL pad
64 Si substrate
65 via inner insulating film
66a via inner insulating film
66b field top insulating film
67 metal wiring
68 solder mask
69 solder ball
111a via inner insulating film
111b field top insulating film
161a via inner insulating film
161b field top insulating film
300 electronic apparatus
301 solid-state imaging element
302 optical lens
303 signal processing circuit

The invention claimed is:

1. A semiconductor element comprising:
a through-silicon via (TSV) formed in a substrate;
a metal wiring;
a silicon substrate under the metal wiring, the silicon substrate comprising a slit having a depth of about ten micrometers;
a film comprising silicon carbide (SiC) in contact with the silicon substrate; and
an insulating film between the metal wiring and the substrate.

2. The semiconductor element of claim 1, wherein the insulating film is embedded in the slit.

3. The semiconductor element of claim 2, wherein the insulating film comprises silicon oxycarbide (SiOC).

4. The semiconductor element of claim 1, wherein the slit has a width of ten micrometers.

5. The semiconductor element of claim 1, wherein the metal wiring covers an inside of the TSV.

6. The semiconductor element of claim 1, wherein the metal wiring comprises copper (Cu).

7. The semiconductor element of claim 1, wherein the insulating film comprises a plurality of film types.

8. A method of manufacturing a semiconductor element, the method comprising:
forming a through-silicon via (TSV) in a substrate;
forming a metal wiring;

forming a silicon substrate under the metal wiring, the silicon substrate comprising a slit having a depth of about ten micrometers;

forming a film comprising silicon carbide (SiC) in contact with the silicon substrate; and forming an insulating film between the metal wiring and the substrate.

9. The method of claim 8, further comprising embedding the insulating film in the slit.

10. The method of claim 9, wherein the insulating film comprises silicon oxycarbide (SiOC).

11. The method of claim 8, wherein the slit has a width of ten micrometers.

12. The method of claim 8, wherein the metal wiring covers an inside of the TSV.

13. The method of claim 8, wherein the metal wiring comprises copper (Cu).

14. The method of claim 8, wherein the insulating film comprises a plurality of film types.

15. An electronic apparatus comprising:
   an imaging element including:
      a through-silicon via (TSV) formed in a substrate;
      a metal wiring;
      a silicon substrate under the metal wiring, the silicon substrate comprising a slit having a depth of about ten micrometers;
      a film comprising silicon carbide (SiC) in contact with the silicon substrate; and
      an insulating film between the metal wiring and the substrate;
   an optical system configured to guide incident light to the imaging element; and
   a signal processing circuit configured to receive a signal output from the imaging element.

16. The electronic apparatus of claim 15, wherein the insulating film is embedded in the slit.

17. The electronic apparatus of claim 16, wherein the insulating film comprises silicon oxycarbide (SiOC).

18. The electronic apparatus of claim 15, wherein the slit has a width of ten micrometers.

19. The electronic apparatus of claim 15, wherein the metal wiring covers an inside of the TSV.

20. The electronic apparatus of claim 15, wherein the metal wiring comprises copper (Cu).

* * * * *